Dec. 13, 1960 K. F. RIESE 2,964,087

MACHINE FOR STRAIGHTENING ELECTRICAL COMPONENT LEADS

Filed July 5, 1955 2 Sheets-Sheet 1

INVENTOR.
KARL F. RIESE

BY
ATTORNEY
William C. Stueber

Dec. 13, 1960 K. F. RIESE 2,964,087

MACHINE FOR STRAIGHTENING ELECTRICAL COMPONENT LEADS

Filed July 5, 1955 2 Sheets-Sheet 2

INVENTOR.
KARL F. RIESE

BY

ATTORNEY
William C. Stueber

United States Patent Office 2,964,087
Patented Dec. 13, 1960

2,964,087

MACHINE FOR STRAIGHTENING ELECTRICAL COMPONENT LEADS

Karl F. Riese, St. Paul, Minn., assignor to General Mills, Inc., a corporation of Delaware Filed July 5, 1955, Ser. No. 519,795
5 Claims. (Cl. 153—32)

The present invention relates to improvements in machines for straightening the leads of electrical components.

Electrical components, as they are received from the manufacturer, frequently have bent or curved leads. The leads may be accidentally bent in the container in which they are shipped by the manufacturer or may be bent by handling. Frequently the amount of distortion or bending of the lead is very small but in many uses of the electrical component it is required that the leads be absolutely straight and accurate.

An example of a use of electrical components wherein the lead should be absolutely straight is in automatic electrical circuit assembly machinery. In this type of machinery, the component is received, usually from a feeder, and the leads are bent by precision mechanism, which requires straight leads with the ends of the leads being bent at right angles to the component body and the ends thereafter inserted into holes in circuit boards. In certain uses, the component lead must first be mechanically prepared before it is inserted into the circuit board such as by attaching a connector at the end or by enlarging the end, or by other treatment including a cutting of the end from the lead. In this type of preparation machinery, as well as in the machinery which inserts the leads into the component boards, the leads must be properly positioned with respect to each other and with respect to the component body as well as being straight so that the machine may accurately handle them without dropping them or distorting them further.

It is an object of the invention to provide an improved machine which will function automatically to straighten the leads of electrical components such as resistors, condensers, transistors, transformers, and the like.

Another object of the invention is to provide an improved machine which will automatically receive an electrical component with leads projecting from the ends and which will simultaneously straighten both leads so as to effect rapid preparation of the component and to straighten both leads on the same axis.

Another object of the invention is to provide a mechanical straightener for component leads which is simple in structure and rapid in operation so as to be adaptable to high speed automatic equipment and which functions automatically in consecutive operations over long operating periods.

Other objects and advantages will become more apparent in the following specification and claims taken in connection with the appended drawings in which:

Figure 2:
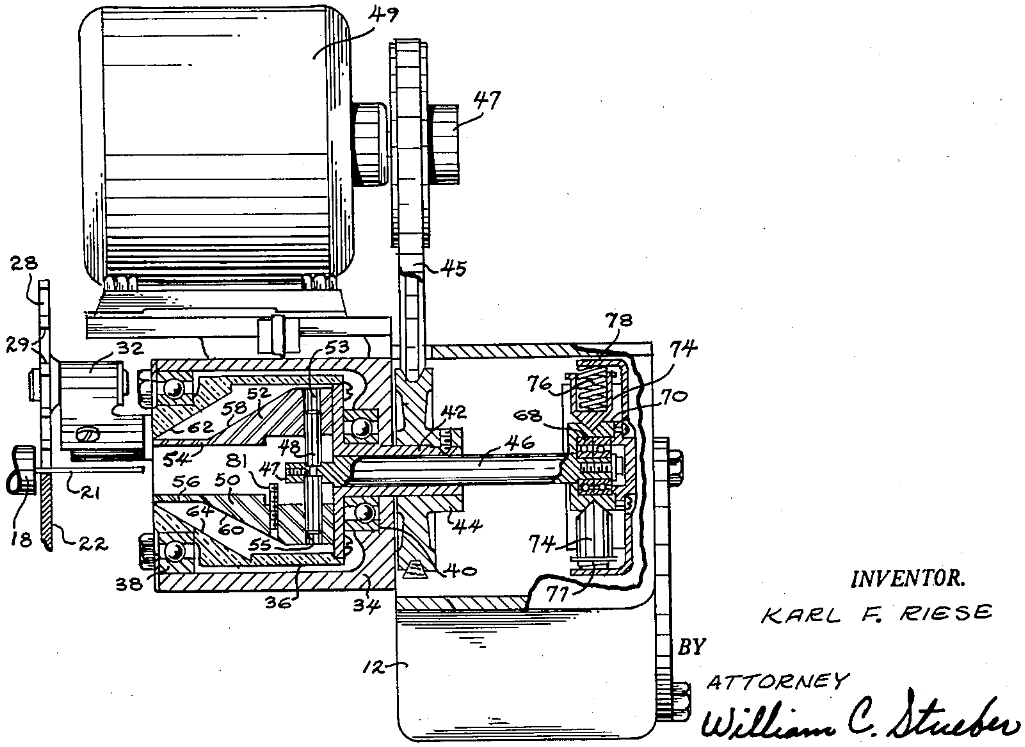
Figure 2 is a detailed front elevational view of the straightener for one of the component leads with the case which contains the operating mechanism being partly in section to better illustrate the details of the operating mechanism.
Figures 3, 4, 5:
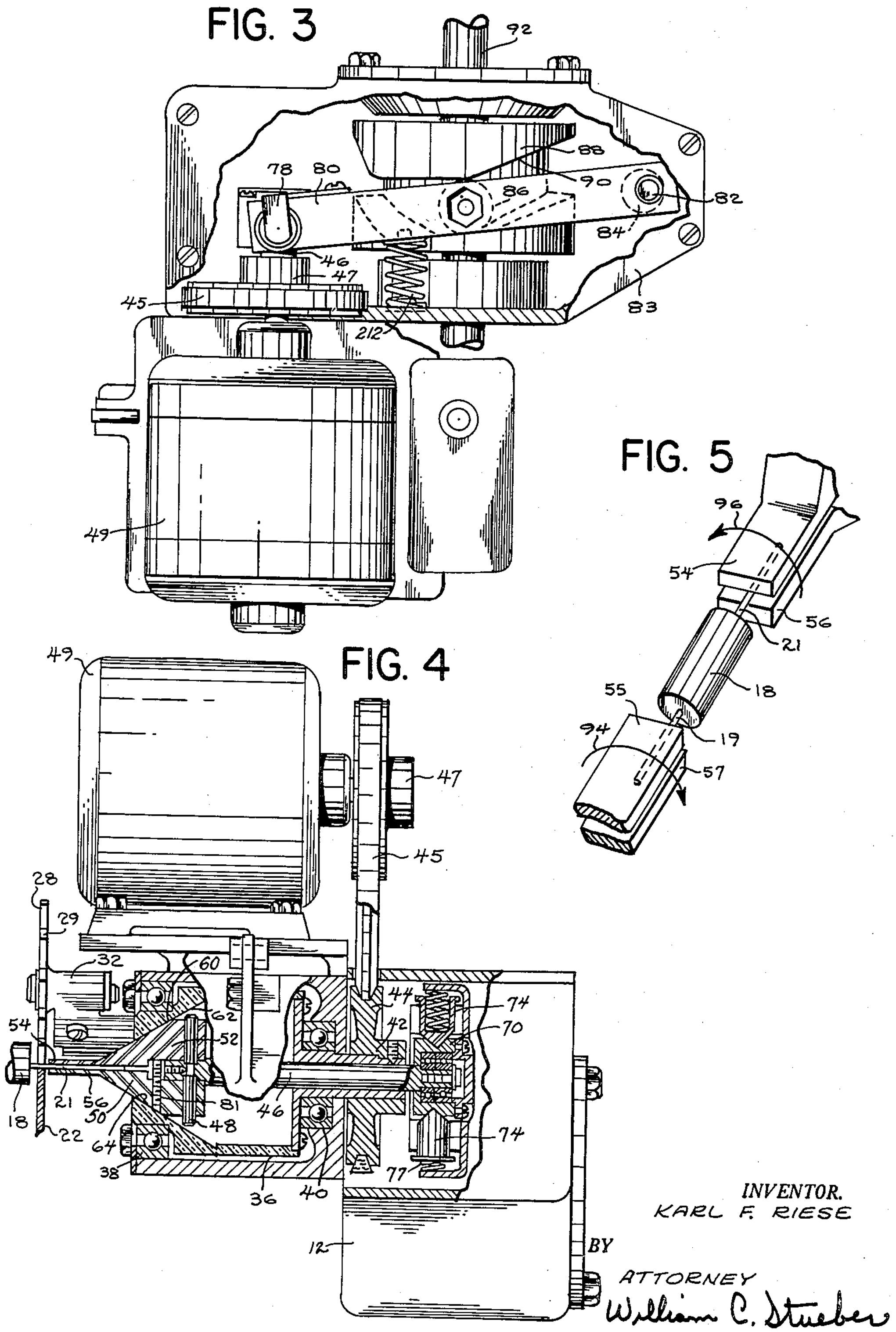
Figure 3 is a plan view of the lead straightening mechanism for one of the component leads with a portion of the operating case being broken away to illustrate the relative position of the operating parts.

Figure 4 is a front elevational view which is similar to Figure 2 with the exception that the lead straightening members are shown in their extended and closed straightening position whereas in Figure 2 they are illustrated in their retracted open position, and Figure 5 is an enlarged perspective view showing the operation of the lead straightening mechanism acting on both component leads at the same time.

Figure 1:
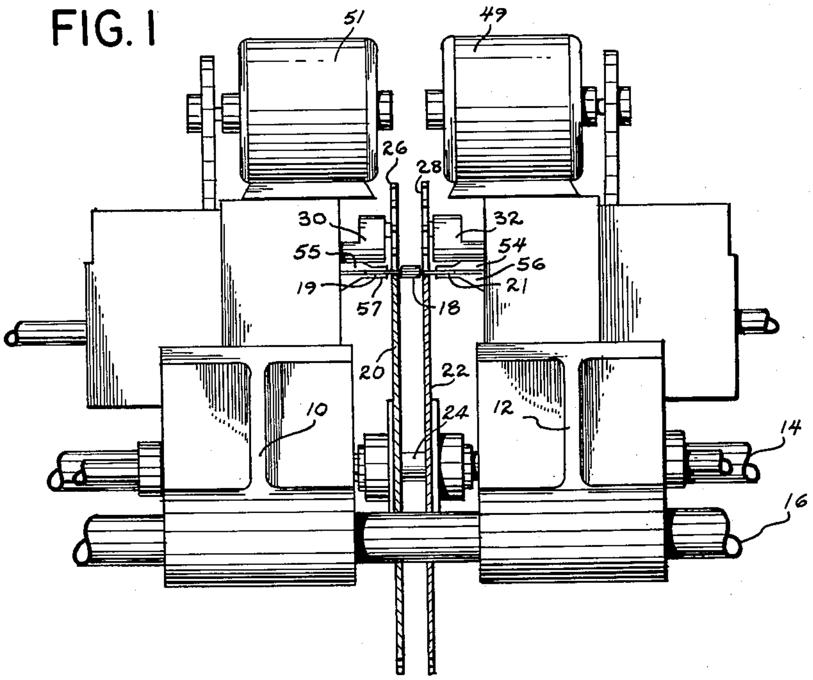
Figure 1 is an overall front elevational view of the mechanism for straightening the leads at two ends of the electrical component.

In the preferred embodiment illustrated in Figure 1, substantially identical mechanisms are provided for straightening the leads at the opposite end of the component which is shown at 18. The mechanisms for straightening the opposite leads are supported on separate frames 10 and 12. These frames are mounted on supporting rods such as are shown in 14 and 16 and may be mounted for sliding movement along these supporting rods so that the distance between the frames may be adjusted. In this manner, if a different size component is to be treated, the frames 10 and 12 can be adjusted to be either closer together or farther apart in accordance with the distance between the ends of the component leads. This adjustment may be accomplished in any one of a number of ways such as by providing a threaded adjustment rod or by merely sliding the frames along the rods and securing them in their adjusted position to the rods.

The component 18, having the leads 19 and 21, is supported by a pair of notched wheels 20 and 22 which support the component by its leads. These transfer wheels are supported on a driving shaft 24 and the wheels are keyed to the shaft so that their lateral position may be adjusted to accommodate electrical components of different sizes.

The electrical components are held in place on the transfer wheels 20 and 22 when the component 18 has been brought into position for straightening the leads. This holding mechanism may take various forms and, as shown, consists of a pair of smaller mating wheels 26 and 28. These wheels press directly against the component lead as shown in the detailed view of Figure 2 with the gripping wheel 28 bearing directly against the component lead 21 which rests against the transfer wheel 22.

One manner of effecting this gripping of the electrical component lead may be accomplished by providing the transfer wheel 22 with notches in which the component lead 21 rides. The gripping wheel 28 may have points such as are shown at 29 which project into the notches in the transfer wheel 22 and these projections bear against the lead 21 adjacent the body 18 of the component.

The gripping wheels, as may be seen in Figure 1, are each supported on a separate shaft and the shafts are supported on castings 30 and 32, these castings being suitably secured to the adjustable frames 10 and 12. Thus, as the frames are adjusted laterally together or away from each other, the gripping wheels 26 and 28 also move together or apart. The gripping wheels, of course, must correspond to the position of the transfer wheels 20 and 22 and these are keyed to the drive shaft 24 so as to be slidably mounted to accommodate a component of a larger or smaller size. The transfer wheels 20 and 22 are driven by a floating keyway on the shaft 24 so that the lateral position of the wheels may be adjusted and fixed.

The component leads are delivered to the machine by being dropped on the transfer wheels 20 and 22. The wheels are then indexed forward to carry the individual components to the lead straightening position such as is shown in Figure 1. After the leads have been straightened, the components may be removed from the transfer wheels. The mechanism for loading the components into the transfer wheels and for removing the components is not shown in detail since it does not constitute a part of this invention.

In Figures 2, 3, and 4, the details of the lead straightening mechanism are shown. The lead straightening mechanism, as was previously mentioned, is substantially the same for each side of the machine and therefore the mechanism for only one of the leads need be described in detail.

The mechanism of Figures 2, 3, and 4 effects a movement of lead straightening fingers 54 and 56 in a lateral direction toward the component lead shown at 21 in Figure 2. Simultaneous with this lateral movement of the lead straightening fingers, the fingers move together so as to slowly clamp down upon the lead. In addition to moving laterally and together, the lead straightening fingers are also given a whirling motion so that they bend the lead from all directions toward the axis of the lead and thus when the fingers have been moved completely together, the lead will be pressed and confined to the proper axis and will have been straightened.

The operating mechanism, as will be viewed in Figure 2, is supported on the frame piece 12. From this frame projects a hollow shell 34. Within the hollow shell is rotatably journaled a rotating shell 36. This rotating shell is journaled by ball bearings 38 and 40 within the fixed hollow shell 34. These ball bearings permit constant rotation of the rotating shell 36 which in turn rotates the lead straightening fingers contained therein. The axis of rotation of the shell and the fingers corresponds to the notch in the delivery wheel so that the lead will be forced to the proper axis during straightening.

For obtaining the rotational motion of the rotating shell 36, the shell carries a laterally projecting hub 42 which is rotatably carried by the ball bearing 40 and is free to turn relative to the finger moving rod 46 slideably journaled therein. The hub 42 carries on it a driving pulley 44 which is driven by the belt 45 which passes over the pulley 47 that is carried on the drive motor 49. This rotational drive motor 49 rotates constantly to impart a constant rotation to the lead straightening fingers and they rotate whether in the lead engaging position of Figure 4 or in the retracted position of Figure 2.

As will be observed in Figure 1, two rotational drive motors 49 and 51 are provided. Each of these motors rotate in the same direction but being positioned back to back on the opposite sides of the machine, they will, therefore, rotate the lead straightening fingers in opposite directions as will be observed in Figure 5 for purposes which will be described later in greater detail.

Thus far, the apparatus for obtaining the rotational movement of the lead straightening fingers 54 and 56 has been described. For obtaining the lateral movement to move the fingers over to bracket the lead 21 and to close the fingers as illustrated in Figure 4, the laterally moving shaft 46 is provided.

The laterally moving shaft 46 carries a guide pin 48 at its inner end, which is the left end 47 illustrated in Figure 2. The laterally moving shaft 46 and its guide pin 48 rotate with the surrounding shell 36. The guide pin 48 projects into bored holes 53 and 55 in the jaws. These holes 53 and 55 in conjunction with the straight guide pin 48 cause the jaws to move laterally as they move in and out and keep the straightening fingers in parallel relationship.

In the position of the jaws 50 and 52 of Figure 2, the jaws are held apart by centrifugal force as they rotate and are closed by moving to the left against the cam surfaces 62 and 64 within the shell.

The jaws 50 and 52 are moved to the left by the laterally moving rod 46 to thereby move the lead straightening fingers 54 and 56 out over the end of the lead 21. As the jaws move to the left, it will be noted that they carry flat tapered surfaces 58 and 60 and these cam surfaces engage the mating flat cam surfaces 62 and 64 which are located on the inner face of the rotating shell 36. The cam surfaces are flat and when the jaws 50 and 52 move to the left, jaw cam surface 58 will engage the inner cam surface of the shell 62, and the cam surface 60 of the jaw will engage the inner cam surface 64 of the rotating shell 36. These cam surfaces of the shell will cam the jaws together and as they slide laterally, the jaws and fingers held are in their parallel positions by the guide pin 48 and the cam surfaces will bring the lead straightening fingers 54 and 56 gently and gradually together in accordance with the taper of the cam surfaces 62 and 64.

When the laterally sliding rod 46 has moved the jaws completely to the left, they will assume the position illustrated in Figure 4. This will have brought the lead straightening fingers 54 and 56 gently together against the lead 21 and as they whirl and are brought against the lead, they will have pushed it firmly to the position of the proper axis and will have straightened any kinks or bends in the lead.

Simultaneously with the jaws 54 and 56 moving together to straighten lead 21, the jaws on the opposing side of the machine numbered 55 and 57 will have moved together to straighten the lead 19 on the component as is illustrated in Figure 1.

To move the rod 46 laterally to move the jaws out over the component lead, a cam and rocker arm arrangement is provided as is shown in Figure 3. The laterally moving rod 46 rotates with the rotating shell 36 and to permit this rotation the apparatus for moving the rod laterally is connected to the rod by a ball bearing indicated at 68 in Figures 2 and 4. This ball bearing is contained within a hub 70 which has notches drilled in its peripheral face to receive pointed pins 74. These connecting pins 74 are forced into the notches by coil compression springs such as shown at 76 and 77. The compression springs bear at their outer ends against a U-shaped yoke member 78 and this yoke member is connected to one arm 80 which is moved laterally to give lateral movement to the laterally moving rod 46 which in turn moves the lead straightening fingers 54 and 56 out over the component lead.

The rocker arm 80 which moves the yoke 78 laterally is shown in detail in Figure 3. This rocker arm is mounted at its base to a pivotal pin 82. The pivotal pin is fixed to the casing 83 by an eccentric such as shown at 84. Rotation of this eccentric will change the position of the pivotal connection of the rocker arm with respect to the case and will control the position of the end of the rocker arm 80 which is connected to the yoke 78. The position of this yoke 78 will determine the amount the reciprocating rod 46 is moved to the left as shown in Figure 4. Moving the rod 46 further to the left will move the lead straightening fingers 54 and 56 further to the left and will also push the jaws 50 and 52 further between the cam surfaces 62 and 64 of the rotating shell. This, of course, will force the fingers 54 and 56 more tightly together. This adjustment is necessary to accommodate leads of different diameters.

Thus, it will be seen by rotating and adjusting the eccentric pivotal mount 84 which controls the position of the rocker arm 80, the final closed distance between the fingers will be controlled. For a component lead of a smaller diameter, the eccentric 84 is set so that the fingers are moved further to the left as is shown on Figure 4. This will press the jaws 52 and 50 which support the fingers more closely together. For a component having thicker leads, the eccentric 84 is set so that the jaws 50 and 52 will not move as far to the left and thus the lead straightening fingers 54 and 56 will not move as closely together. The jaws should move a distance to the left so that the fingers move together to a point where their spacing is approximately equal to the diameter of the component lead. This will remove all the curves and kinks from the lead. Of course, it may be desired to only remove a portion of the distortion from the component leads, and in this case, the lead straightening fingers need not be pressed so tightly together and the lead will be straightened only the amount that the lead strightening fingers approach each other.

To positively control the minimum distance between the lead straightening fingers a spacer 81 may be provided. This spacer is shown in the form of a set screw in Figures 2 and 4, which is threaded into the jaw 50, as the opposing jaw 52 moves toward the jaw 50 it will engage the head of the spacer set screw 81 which limits the movement. The closed distance between the jaws may be adjusted by threading the set screw in or out.

Returning to Figure 3, the rocker arm 80 which moves the lead straightening fingers over the component lead which automatically moves them together, is shown carrying a follower 86 which rides the track 90 on the barrel cam 88. This track 90 is so arranged that it will swing the rocker arm 80 back and forth to thereby operate the lead straightening fingers. A compression spring 212 projects between the case 83 and the rocker arm so that the follower will remain at one side of the cam track and will not be subject to play which may occur with some wear in the barrel cam.

The cam is carried on a drive shaft 92 and this drive shaft is rotated in synchronism with the index shaft 24 which carries on it the transfer wheel. Thus, as the transfer of each new component is moved into lead straightening position, the drive shaft 92 makes one complete revolution and causes one complete operation of the straightening fingers.

As was previously discussed, the lead straightening fingers operate simultaneously from the two sides of the component. Another feature of this operation is that the lead straightening fingers operate together and rotate in opposite directions as are indicated by the arrows 94 and 96 of Figure 5. This simultaneous operation reduces the tendency of the component body 18 to spin due to the friction between the straightening fingers and the component leads. Since the friction will be substantially equal for the two leads the forces will be in equal and opposing directions. Although the component leads are clamped adjacent the component body, the rotational movement of the lead straightening fingers in the opposite direction will reduce the tendency of the component to spin due to the friction between the lead straightening fingers and the leads. If desired, additional component clamping means may be provided such as a padded clamp for gripping the component body.

In summary, the operation of the mechanism is as follows. The components such as illustrated at 18 in Figure 1 are carried forward to the lead straightening position by the transfer wheels 20 and 22. At the point, the lead straightening fingers such as illustrated at 54, 56 from one side of the machine and 55, 57 from the other side of the machine move toward and against the leads 19 and 21 of the component. As they do so, they spin in opposite directions and clamp the leads straightening any kinks or bends in the leads and moving the leads to the proper axis of the component body.

The lead straightening fingers such as shown in Figure 2 at 54 and 56 are carried on jaws 52 and 50. These jaws spin the lead straightening fingers and move outwardly over the component leads with the fingers converging as the jaws are pushed against the slanting converging cam surfaces 62 and 64. These cam surfaces will force the jaws and the leads together to flatten the component lead. The jaws are kept parallel by a guide pin 48 which slides in the bore holes 53 and 55 of the jaws.

To rotate the lead straightening fingers, the supporting jaws and associated mechanism are carried within a rotating shell 36 which is supported within the fixed shell 34. This shell is rotated by the drive pulley 44 which secures to the top of the shell 42.

For moving the lead straightening fingers out over the leads, the push rod 46 is moved outwardly. For this purpose, the end of the rod is rotatably secured, to permit rotation of the rod, to a yoke 78 by pointed contact pins 74 which project into notches in a hub 70.

The yoke is connected to a pivotal rocker arm 80 as is shown in Figure 3 and this arm pivots back and forth by means of a follower 86 which projects into the groove of a barrel cam 88 driven by the shaft 92. As the shaft 92 rotates, the arm will swing back and forth to move the straightening fingers out over the lead to the position of Figure 4 and again to retract them to the position of Figure 2.

It will thus be seen that a lead straightening mechanism has been provided which is capable of rapidly and simultaneously straightening both leads of the component. The fingers of the lead straighteners rotate in opposite directions to prevent spinning of the component and dislodging it from its support or damaging it.

The mechanism is adaptable to continuous high speed operation and requires only the adjustment of the eccentric which supports the base of the rocker arm 80 which in turn controls the spacing between the lead straightening fingers at closed position. The lead straightening fingers rotate constantly thus reducing the need for any starting or stopping clutch mechanism and they are retracted completely out of the way between operations so that their spinning motion will not damage or engage the new component which is moved into lead straightening position.

I have, in the drawings and specification, presented a detailed disclosure of the preferred embodiment of my invention. It is to be understood that the invention is susceptible of modifications, structural changes and various applications of use within the spirit and scope of the invention and I do not intend to limit the invention to the specific form disclosed but intend to cover all modifications, changes and alternative constructions and methods falling within the scope of the principles taught by my invention.

I claim as my invention:

1. The method of straightening the leads of an electrical component comprising rotating a pair of straightening surfaces about the component axis while maintaining the surfaces equidistant from the axis of the component, bringing the straightening surfaces toward one of the leads until they are spaced apart substantially the diameter of the lead, simultaneously rotating a second pair of straightening surfaces in the opposite direction about the component axis, and bringing said second pair of surfaces together simultaneously with said straightening surfaces until spaced apart the thickness of the other component lead.

2. The method of straightening the leads of an electrical component comprising supporting the component, rotating a first pair of straightening surfaces about the component axis while maintaining the surfaces equidistant from the axis of the component and bringing the straightening surfaces toward one of the component leads until they are spaced apart substantially the diameter of the lead, and simultaneously rotating a second pair of straightening surfaces in the opposite direction about the other lead and bringing the second pair of surfaces together simultaneously with said first pair until spaced apart substantially the thickness of the component lead.

3. A mechanism for straightening the leads of an electrical component comprising a first pair of lead straightening fingers substantially parallel to each other and having lead engaging surfaces, a second pair of lead straightening fingers substantially parallel to each other and having surfaces for engaging the opposing lead of an electrical component, means to rotate the first pair of lead straightening fingers about the axis of the lead, and means to simultaneously rotate the second pair of lead straightening fingers in a direction opposite from the first and about the same axis, means to move the first pair of lead straightening fingers together while they are being rotated against the component lead and to simultaneously move the second pair of lead straightening fingers together while they are being rotated about the component lead.

4. A mechanism for straightening the opposing leads of an electrical component comprising a plurality of pairs of lead straightening fingers, supporting jaws for each of the lead straightening fingers, cam surfaces adapted to be engaged by the jaws to move the jaws together and thereby move the lead straightening fingers together simultaneously over the opposing component leads, means to simultaneously rotate the jaws to rotate the fingers about the leads, said means rotating at least one pair of jaws and fingers in one direction over one of said component leads and rotating another pair of jaws and fingers in the opposite direction over the opposing component lead, and means to simultaneously move the jaws and the fingers toward the cam surfaces to cam the fingers together, and means to adjust the travel of the jaws to control the amount that the cams will move the jaws and the fingers together in accordance with the diameter of the leads of the component.

5. A mechanism for straightening the opposing leads of an electrical component comprising a first and second pair of lead straightening fingers each having opposed parallel lead straightening surfaces, a pair of jaws supporting each of the pair of fingers, means adapted to hold the jaws in parallel relationship when they are moved together, a pair of cam surfaces positioned to be engaged by the jaws to move the jaws together, means to rotate the jaws and cam surfaces to rotate the fingers simultaneously for straightening and to hold the jaws outwardly by centrifugal force, said means rotating in opposite directions the jaw pairs and fingers which operate on the respective opposing leads and means to move the jaws simultaneously laterally against the cam surfaces during simultaneous rotation to simultaneously close the straightening fingers over the opposing leads and thereby straighten the leads.

References Cited in the file of this patent

UNITED STATES PATENTS

| | | |
|---|---|---|
| 1,182,658 | Dolles | May 9, 1916 |
| 1,206,240 | Norton | Nov. 28, 1916 |
| 2,609,858 | Engel | Sept. 9, 1952 |
| 2,685,961 | Schuler | Aug. 10, 1954 |

FOREIGN PATENTS

| | | |
|---|---|---|
| 310,884 | Switzerland | Jan. 14, 1956 |